United States Patent [19]

Chou

[11] 3,944,990

[45] Mar. 16, 1976

[54] SEMICONDUCTOR MEMORY EMPLOYING CHARGE-COUPLED SHIFT REGISTERS WITH MULTIPLEXED REFRESH AMPLIFIERS

[75] Inventor: Sunlin Chou, Santa Clara, Calif.

[73] Assignee: Intel Corporation, Santa Clara, Calif.

[22] Filed: Dec. 6, 1974

[21] Appl. No.: 530,161

[52] U.S. Cl. 340/173 RC; 307/221 D; 340/173 DR; 357/24
[51] Int. Cl.² G11C 19/28; G11C 21/00; G11C 7/00
[58] Field of Search... 340/173 R, 173 CA, 173 DR; 357/24; 307/221 D, 304; 29/571

[56] References Cited
UNITED STATES PATENTS 3,760,202  9/1973  Kosonocky .................... 357/24

*Primary Examiner*—Stuart N. Hecker
*Attorney, Agent, or Firm*—Spensley, Horn & Lubitz

[57] ABSTRACT

A serial memory employing a plurality of charge-coupled shift registers fabricated with MOS technology and using double layer polycrystalline silicon gates. Each shift register includes two pairs of parallel channels; charge flows in opposite directions in each pair of channels. Multiplexing is utilized to refresh charge between each pair of channels through two refreshing amplifiers, one disposed at each end of the channels. The topographical efficiency of the design permits fabrication of a dense memory.

17 Claims, 4 Drawing Figures

SEMICONDUCTOR MEMORY EMPLOYING CHARGE-COUPLED SHIFT REGISTERS WITH MULTIPLEXED REFRESH AMPLIFIERS

BACKGROUND OF THE INVENTION

1. Field of the Invention

The invention relates to the field of charge-coupled devices (CCD) particularly charge-coupled memories.

2. Prior Art

Charge-coupled devices for a number of years have been investigated and used, particularly experimentally, for memories, video displays and other applications. For a discussion of CCD technology and its applications, see "Charge-Coupled Devices — A New Approach to MIS Device Structures," *IEEE Spectrum*, July 1971, by Boyle and Smith, beginning at page 18.

One application for charge-coupled devices has been semiconductor memories, particularly those employing metal-oxide-silicon (MOS) technology. For example, a plurality of charge-coupled recirculating shift registers have been employed for fabricating serial memories. While these memories have considerably slower access times than most random-access-memories employing MOS technology, they nonetheless fill the gap, in terms of cost per bit of storage, between the fast access time RAMs and memory systems employing magnetic disks and tapes. For an analysis of the costs versus access times for various memories, see "Charge-Coupled Devices Move in on Memories and Analog Signal Processing," *Electronics*, Aug. 8, 1974 by Laurence Altman, beginning on page 91.

CCD memories are capable of being fabricated at lower cost (in terms of cost per bit of storage) when compared to other semiconductor memories because higher CCD densities are possible. Typically in the fabrication of semiconductor memories yields are not directly affected by density, and hence higher densities generally result in less costly memories.

In order to achieve these higher densities for CCD memories circuit topology or layout becomes an important consideration in the design of a memory. The present invention discloses a unique arrangement for recirculating shift registers employed in a CCD memory which provides a highly efficient layout. In the presently preferred embodiment the design is utilized to fabricate a 16K memory.

SUMMARY OF THE INVENTION

A semiconductor serial memory employing a plurality of charge-coupled recirculating shift registers is disclosed. In the presently preferred embodiment the memory stores 16,384 bits on a single silicon substrate and is fabricated with MOS technology, using n-channel devices and double polycrystalline silicon layers. Each of the recirculating charge-coupled shift registers includes a first, second, third and fourth parallel channels. Stored data in the form of charge is shifted by a four-phase clock input in one direction in the first and second channels and in the opposite direction in the third and fourth channels. A first refresh amplifier receives charge from one end of the first and second channels, and after refreshing the charge furnishes an output charge to one end of the third and fourth channels. A second refreshing amplifier receives charge from the other end of the third and fourth channels and provides a refreshed charge to the other end of the first and second channels. Multiplexing is utilized permitting a single refresh amplifier to refresh charge from two channels. The gates disposed above the channels are utilized for shifting charge and for the multiplexing of charge from two channels to a single refresh amplifier. These gates are disposed on two different levels above the channels, each level comprising polycrystalline silicon.

DETAILED DESCRIPTION OF THE INVENTION

The present invention discloses a recirculating shift register particularly adaptable for use in a serial memory. In the presently preferred embodiment 64 recirculating shift registers, each storing 256 bits of data, are used to form a 16,384 bit CCD serial memory. The entire memory is fabricated on a single silicon substrate employing MOS technology and utilizing n-channel charge-coupled shift registers. A plurality of transistors are also utilized in the memory, all of which comprise n-channel, enhancement mode, field effect transistors, employing polycrystalline silicon gates. The memory may be fabricated utilizing known techniques including ion implantation. In the presently preferred embodiment two layers of polycrystalline silicon separated from one another and from the substrate by oxide layers, are used to define lines in the array, which lines define the gates employed for shifting charge in the shift registers. As will be appreciated, the specific details disclosed herein, such as the specific number of bits in the registers or memory, the number of phases in the timing signals, the specific fabrication technique and numerous other details, are not intended to limit the scope or application of the present invention but rather to provide a fuller understanding of the invention.

Figure 1:
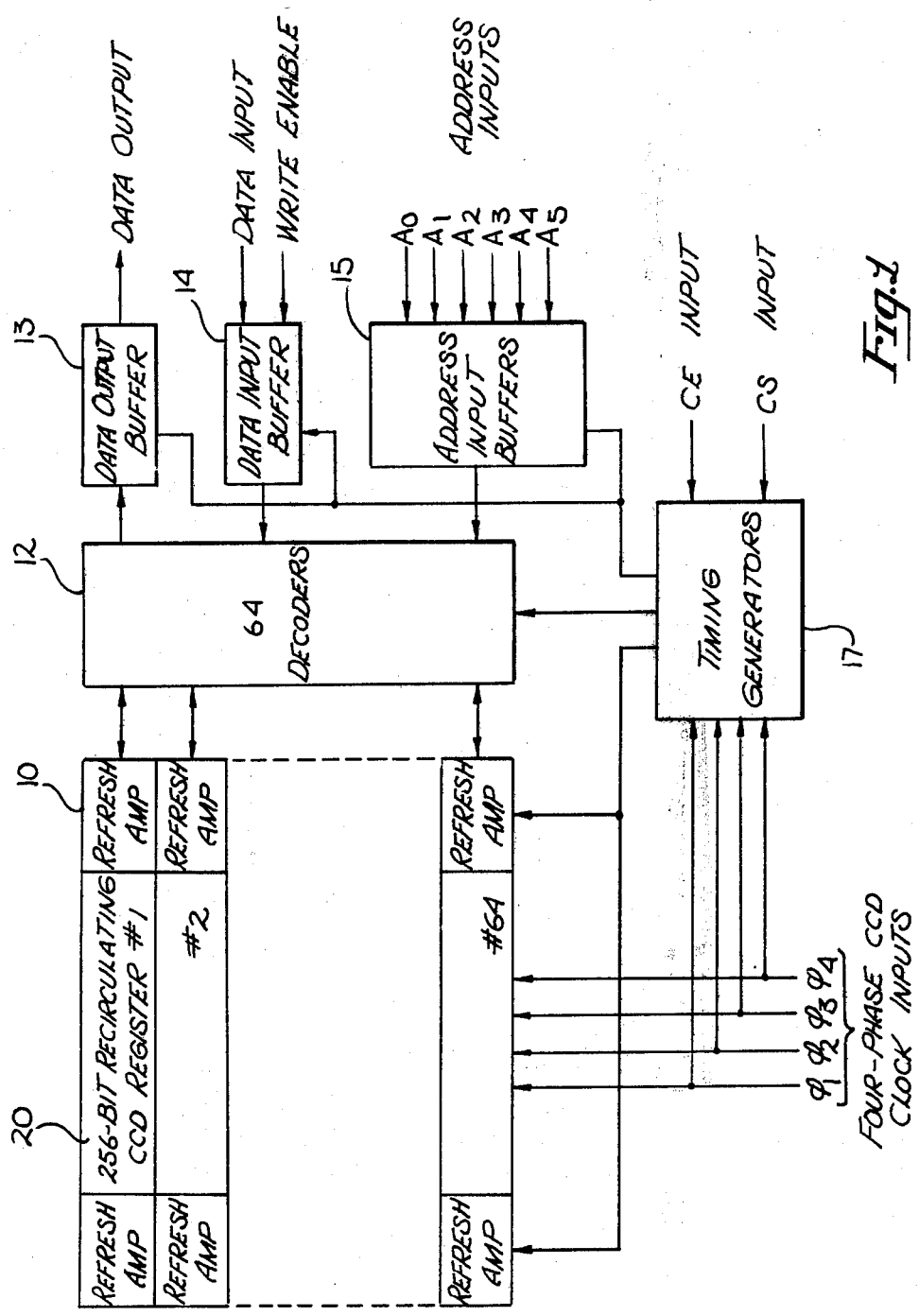
FIG. 1 is a general block diagram of the presently preferred embodiment of a memory employing the recirculating shift registers of the present invention.

Referring first to FIG. 1, the primary sections of the memory, include a plurality of recirculating registers 10 are shown. Each of these registers, such as register 20, is a 256 bit recirculating charge-coupled register and includes a pair of refresh amplifiers. The memory stores data or information in the array in the form of charge as is customary for such memories. The memory includes decoders 12 which receive the address inputs from the address input buffers 15. As with other memories, the address input such as $A_1$ through $A_5$ are utilized for selecting one of the 64 recirculating registers contained within the memory.

Figure 4:
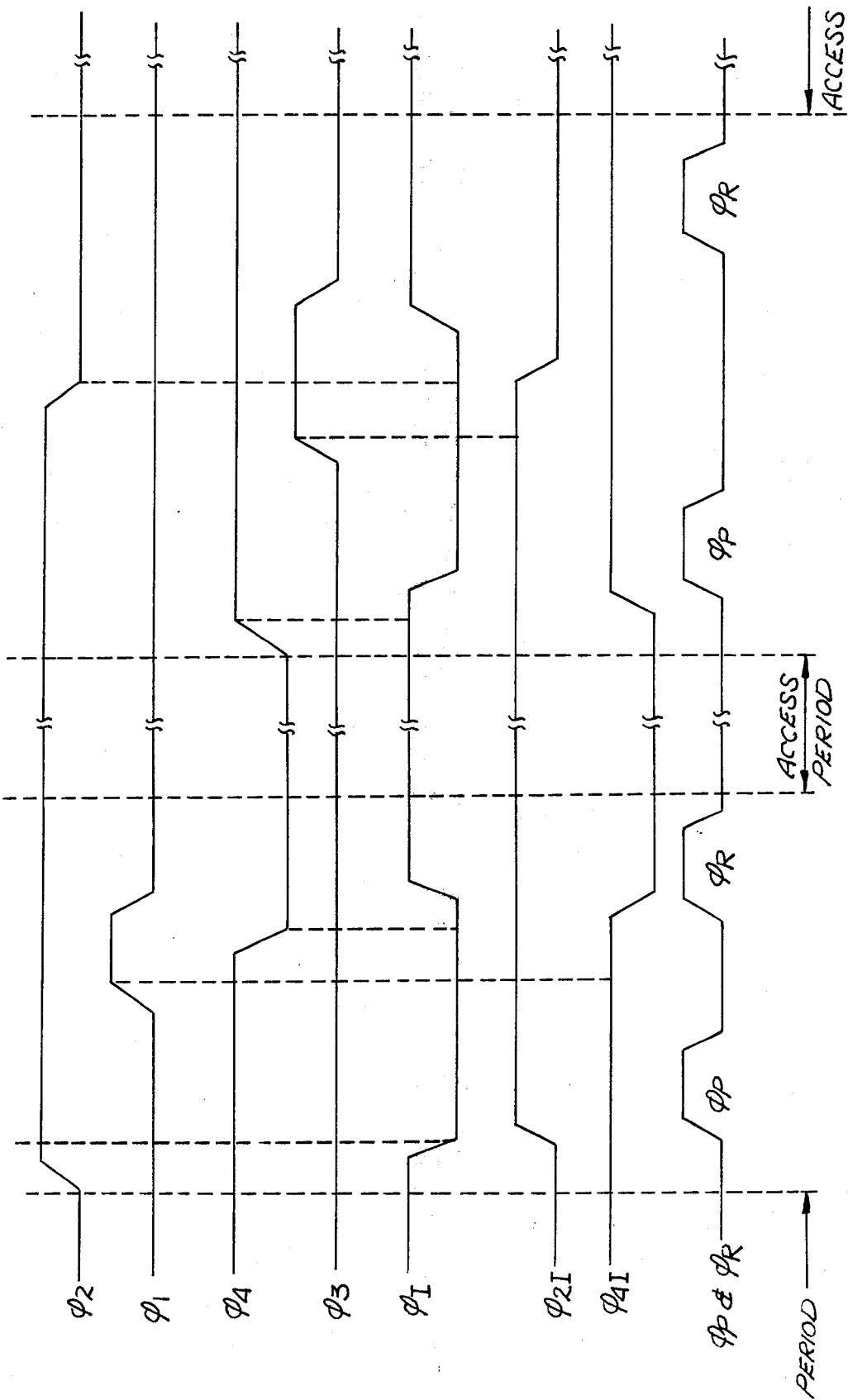
FIG. 4 is a timing diagram illustrating the various timing signals utilized in the shift register and memory.

Information to be stored within the memory is applied to the data input line which is coupled to the data input buffer 14. This buffer communicates through the decoders with the storage registers 10. Stored data which is to be read from the memory is communicated from the registers 10 through the decoders 12 to the data output line, and then to the data output buffer 13. In the presently preferred embodiment four phase clock inputs are utilized and identified as $\phi_1$, $\phi_2$, $\phi_3$ and $\phi_4$. The waveforms associated with these four timing signals are illustrated in FIG. 4. From these four timing signals other timing signals are generated within the timing generator 17. Specifically, the signals $\phi_1$, $\phi_{2I}$, $\phi_{4I}$, $\phi_P$ and $\phi_R$ all of which are also shown in FIG. 4. Other inputs to the memory include the chip enable signal shown as CE input and the chip select signal shown as the CS input. The decoders 12, buffers 13, 14 and 12, and generators 17 may be fabricated utilizing known technology.

Referring to FIG. 4 and the timing signals shown therein, during each complete timing cycle there are two access periods, as shown, during which one or more of the registers may be accessed. Note that the lines representing the timing signals are shown broken during each of the access periods to indicate that the access periods are much greater in duration than indicated in FIG. 4.

Figure 2:
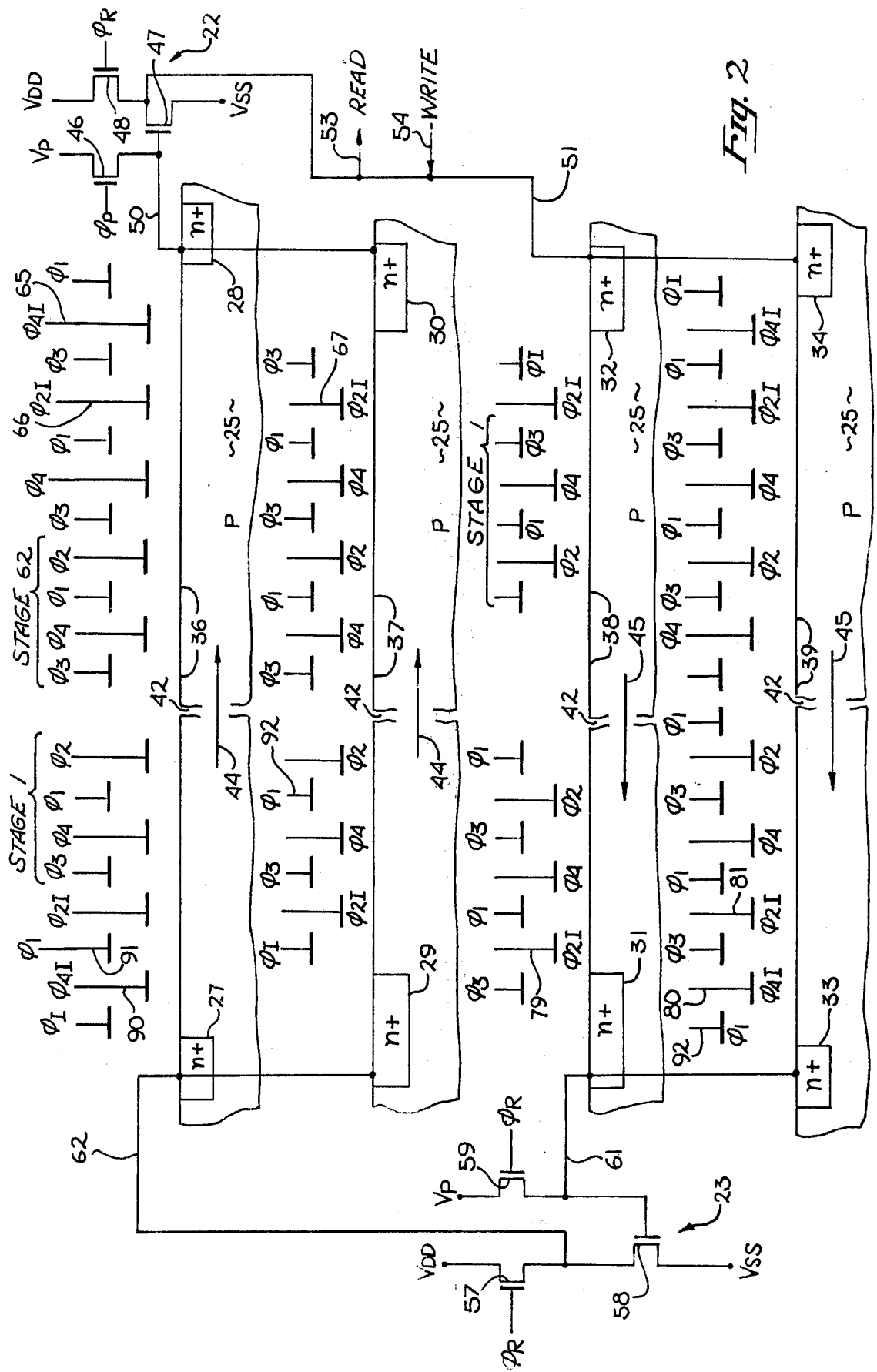
FIG. 2 is a circuit diagram illustrating a single recirculating shift register and refresh amplifiers fabricated in accordance with the present invention.
Figure 3:
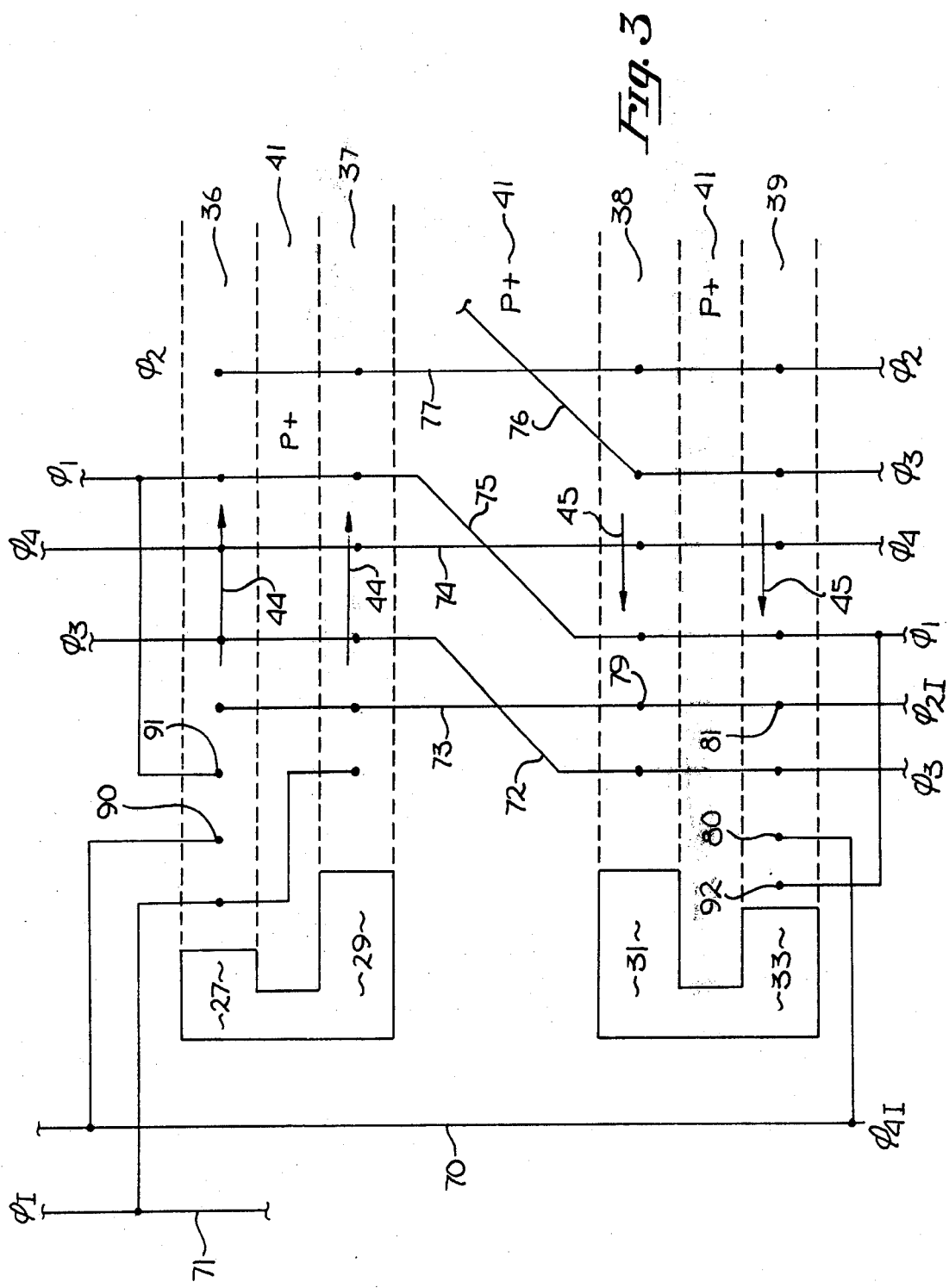
FIG. 3 is a plan view of a portion of the recirculating shift register used to illustrate the manner in which the gates of the register are interconnected.

Referring now to FIGS. 2 and 3, the construction of a single recirculating charge-coupled register, such as register 20 of FIG. 1, will be discussed. Each register includes four parallel channels in juxtaposition with each channel being defined by a pair of regions. In FIG. 2 channel 36 is shown in the p-type substrate 25 between the n+ regions 27 and 28. Channel 37 is illustrated disposed between the n+ regions 29 and 30, again in the p-type substrate 25. Similarly, channel 38 is defined by the n+ regions 31 and 32, and channel 39 is defined by the n+ regions 33 and 34. Note that the regions 29, 30, 31 and 32 are larger in area than the regions 27, 28, 33 and 34. Only a short length of each of the channels is illustrated in FIG. 2 as indicated by the break 42 in the substrate 25. In the presently preferred embodiment p+ channel stops 41 (FIG. 3) are disposed between each of the parallel channels 36, 37, 38 and 39. These p+ type channel stops are formed in the p-type host substrate by ion implantation. The interconnections between regions 27 and 29, 31 and 33, 28 and 30, and 32 and 34 are formed by diffused n-type regions as seen in FIG. 3.

One refresh amplifier is utilized at each end of the channels in order to permit the recirculation and detection of charge. One amplifier 22 comprises field effect transistors 46, 47 and 48, while the other amplifier 23 comprises transistors 57, 58 and 59. These amplifiers are substantially identical and operate in an identical fashion. The control circuitry for read/write function has not been shown, in order not to over-complicate the drawings. This circuitry may be fabricated using known designs and technology. The input or sensing node for the refresh amplifier 22 is node 50 which is common with the output regions 28 and 30. The input node 50 is coupled to the gate of the sensing transistor 47 to the source of transistor 46. As will be discussed, transistor 46 is used to precharge node 50 during the period of time that $\phi_P$ is positive. The sensing transistor 47 has its source coupled to ground (the $V_{SS}$ potential) while its output line 51 is coupled to the $V_{DD}$ potential through transistor 48. Transistor 48 is used for charging the output line 51 of amplifier 22 during the period of time that $\phi_R$ is positive. The output line 51 is coupled to the input regions 32 and 34 of channels 38 and 39, respectively. This line is also utilized for reading information from the register on line 53 and for writing information into the register on line 54. The buffer amplifiers and timing circuitry utilized for performing the read and write functions are not illustrated in order not to overcomplicate the present disclosure. These buffers may be fabricated utilizing known circuitry and employing field effect transistors.

The other refreshing amplifier, amplifier 23, includes an input or sensing node 61 which is common with output regions 31 and 33, and which is coupled to the gate of the sensing transistor 58. Transistor 59 is utilized to precharge node 61 in the same manner as transistor 46 is used to precharge node 50 of amplifier 22. The output line 62 of amplifier 23 which is coupled to the common junction between transistors 57 and 58 provides a refreshed or output charge to the input regions 27 and 29. Transistor 57 is utilized in the same manner as transistor 48, that is, to charge the output line 62 during the period of time that $\phi_R$ is positive.

As is the case with other charge-coupled devices, particularly shift registers, a plurality of gates are disposed above each of the channels 36, 37, 38 and 39 and are used to shift charge along the channels. The gates disposed above channels 36 and 37 shift charge in these channels in the direction indicated by arrows 44, while the gates disposed above channels 38 and 39 shift charge in the opposite direction as indicated by arrows 45. The gates are defined by lines of polycrystalline silicon which run generally transversely to the channels. In the presently preferred embodiment the gates are either on a first level above the channel or on a second level as indicated in FIG. 2. Those gates which are closer to the channels are coupled to the source of timing signals which contain even numbers such as $\phi_2$, $\phi_4$, $\phi_{2I}$ and $\phi_{4I}$, while those gates which are on the upper or second level, that is further from the channel, are coupled to the source of timing signals which include odd substrips such as $\phi_1$, $\phi_3$; $\phi_I$ is included in this latter group.

Referring primarily to FIGS. 2 and 4, the timing signals $\phi_2$ and $\phi_4$ and the gates to which they are coupled are primarily used to store charge, and hence either $\phi_2$ or $\phi_4$ are positive during each of the access periods. The timing signals $\phi_1$ and $\phi_3$ and the gates to which they are coupled are used to transfer charge between the wells defined beneath other gates, and hence the $\phi_1$ and $\phi_3$ signals are at zero potential during the access periods. Thus the output region of each channel, that is regions 28 and 30 for channels 36 and 37, respectively, are adjacent to gates coupled to the source of the $\phi_1$ and $\phi_3$ signals, respectively. Similarly, the output region 31 and 33 for channels 38 and 39, respectively, are adjacent to gates which are coupled to the source of the $\phi_3$ and the $\phi_1$ signal.

The input regions for channels 36 and 37, regions 27 and 29, respectively, are each immediately adjacent to a gate coupled to the $\phi_I$ potential. In a similar manner the input regions 32 and 34 for channels 38 and 39, respectively, are each adjacent to a gate coupled to the source of the $\phi_I$ potential. Adjacent to each of the gates coupled to the $\phi_I$ potential is a gate coupled to either the $\phi_{2I}$ potential or the $\phi_{4I}$ potential (such as gate 90). The $\phi_I$ signal and the $\phi_{2I}$ or $\phi_{4I}$ signal are utilized, as will be discussed in more detail, to transfer charge into the channel from the adjacent input region.

While those timing signals designated with an "I" subscript are generally used to assure proper operation at the input regions to each of the channels, nonetheless gates coupled to these signals are shown at the output regions. For example, gates 65 and 66 are shown near the output region 28. Likewise, gate 67, which is coupled to the source of the $\phi_{2I}$ signal, is near the output region 30. Similarly, gate 79 is near the output region 31, and gates 80 and 81 are close to the output region 33. The use of the timing signals with an "I" subscript for gates 65, 66, 67 and gates 79, 80 and 81 is to obtain greater layout efficiency as will be explained in more detail in conjunction with FIG. 3. Each of these gates could have been coupled to a source of a timing signal not having an "I" subscript, for example gates 65 and 80 could have been coupled to the source of the $\phi_4$ signal, while gates 66 and 81 could have been coupled to the source of the $\phi_2$ signal.

Note that the gates disposed above channels 36 and 37 for any particular stage of the register, for example, for stage 1, have their gates coupled to timing signals in the following sequence: $\phi_3$, $\phi_4$, $\phi_1$ and $\phi_2$ (reading from left to right). On the other hand, the gates disposed above channels 38 and 39 for any stage of the register again reading from right to left, are coupled to timing signals in the following sequence: $\phi_2$, $\phi_1$, $\phi_4$ and $\phi_3$. This reversal of order in the timing signals applied to the gates determines the direction in which charge will move; that is, in channels 36 and 37, the charge moves in the direction indicated by arrows 44, whereas for channels 38 and 39 it moves in the direction indicated by arrows 45.

Referring now to FIG. 3, the partial plan view of the channels 36, 37, 38 and 39 is illustrated separated by the channel stops 41. The regions 27, 29, 31 and 33 are illustrated at one end (the non-decoder end) of each of the channels. The lines 72, 73, 74, 75, 76 and 77 extend, in the presently preferred embodiment, generally transversely over each channel of each shift register in the memory. While these lines have been shown as thin lines in FIG. 3, in the presently preferred embodiment these lines are strip-like lines defining gates over the channels. Moreover, each gate on the upper level of polycrystalline silicon when viewed from the channel, is overlapped by the adjacent gates on the lower level of polycrystalline silicon. This overlapping of gates is more readily seen from FIG. 2.

As mentioned, for the most part the lines defining the gates extend transversely above the channels, this is true for all the lines except those lines coupled to the source of the $\phi_I$ and $\phi_{4I}$ signals. Thus, line 71 which carries the $\phi_I$ signal is disposed to the left of the regions 27, 29, 31 and 33 in FIG. 3. Similarly, line 70 which is coupled to the source of the $\phi_{4I}$ signal, is disposed parallel to line 71, and again to the left of the regions 27, 29, 31 and 33. On the opposite side of the channel (not illustrated in FIG. 3) lines symetrical to lines 70 and 71 are utilized. Line 71 through a generally lateral extension, defines a gate adjacent to the input regions 27 and 29 of channels 36 and 37, respectively. Line 70 in a similar fashion defines gate 90 above channel 36 and gate 80 above channel 39. There are also generally lateral extensions of line 75 to define gate 91 above channel 36 and gate 92 above channel 39.

Lines 74 and 77 which carry the $\phi_2$ and the $\phi_4$ signals and which are disposed on the lower level of polycrystalline silicon extend in a straight line fashion above each channel of each shift register. Other lines carrying the $\phi_2$ and $\phi_4$ signal associated with the other stages of the shift register, not illustrated in FIG. 3, would extend above the channels in the same manner.

Line 72 which carries the $\phi_3$ signal is disposed between lines 73 and 74 over channels 36 and 37, but then crosses over line 73 to define gates over channels 38 and 39. Similarly, line 75 which defines gates between line 77 and 74 over channels 36 and 37, crosses over line 74 and defines gates between lines 73 and 74 over channels 38 and 39. Line 76 in a similar manner to line 72 crosses over line 77. The crossovers shown between channels 37 and 38 in line 72, 75 and 76 continue in a similar manner along the shift register for those lines carrying the $\phi_1$ and the $\phi_3$ signals for each stage of the register. Since the lines carrying the $\phi_1$ and $\phi_3$ signals are on the upper level of polycrystalline silicon, they may readily be fabricated to cross over the lower level lines associated with the $\phi_2$ and $\phi_4$ signals. It is this crossing over of these lines which provides a flow of charge in one direction in channels 36 and 37 and a flow of charge in the opposite direction in channels 38 and 39.

Referring to FIG. 3, assume that other shift registers are to be disposed parallel to the partial register shown in FIG. 3 such as is illustrated in the array of registers 10 in FIG. 1. Assume further as the case in the presently preferred embodiment, that these other registers include two pairs of channels. If a register were to be disposed in juxtaposition to the register shown in FIG. 3, the pair of channels adjacent to channels 38 and 39 would again include gates defined by lines 72, 73, 74, 75, 76 and 77. These lines in the presently preferred embodiment do not have any cross overs between shift registers, but rather only between the pairs of channels of each shift register. Thus, charge in the adjacent channels of adjacent shift registers is shifted in the same direction as charge in the shift register shown in FIG. 3.

As previously mentioned, gates 79 and 81 could have been coupled to the source of the $\phi_2$ signal but instead are coupled to the source of the $\phi_{2I}$ signal (line 73 of FIG. 3). As may be seen in FIG. 3, this connection for gates 79 and 81 provides a more efficient design.

Referring to FIGS. 2, 3 and 4, the operation of the recirculating shift register will be explained. Assume for a starting point of the explanation, that charge representative of a binary "1" is transferred into region 28 during the period of time that $\phi_1$ is positive. Note that prior to the time that $\phi_1$ becomes positive (see FIG. 4), $\phi_P$ is positive, hence transistor 46 conducts and node 50 is precharged positively from $V_P$. (See copending application Ser. No. 536,797, filed Dec. 27, 1974, assigned to the assignee of the present application, for a system for generating the potential $V_P$.) Thus, prior to the time that the negative charge is moved into region 28 from channel 36, since node 50 is precharged positively, transistor 47 is conducting. This provides a path from the ground potential $V_{SS}$ through transistor 47 to the input regions 32 and 34. Thus, these input regions are at ground potential when $\phi_1$ becomes positive.

When $\phi_1$ becomes positive and negative charge is transferred from the well beneath gate 65 into region 28, since a binary "1" was transferred into region 28, the positive "charge" placed on node 50 is removed so that the potential on node 50 falls below the threshold of transistor 47, thus transistor 47 ceases to conduct. Also, $\phi_I$ becomes positive, and since $\phi_{2I}$ is already positive, a deep potential well is formed adjacent to the input region 32 of channel 38. This well is filled with electrons from region 32. When $\phi_R$ becomes positive and transistor 48 conducts, line 51 is pulled towards $V_{DD}$ and a substantial portion of the electrons stored below the gates adjacent to region 32 are drawn-off. The charge remaining below these gates, and particularly gate $\phi_{2I}$, is representative of a binary "0." Thus, when charge representative of a binary "1" is sensed on node 50, charge representative of a binary "0" is returned to either channel 38 or 39. The charge representative of a binary "0" which is transferred from beneath the gates adjacent to the region 32 is moved along channel 38 by the signals $\phi_1$, $\phi_2$, $\phi_3$, $\phi_4$ in an ordinary manner for a four phase system.

Following the detection of a binary "1" on node 50, assume that when next $\phi_3$ becomes positive, charge representative of a binary "0" is transferred from channel 32 into region 30. When this occurs node 50, which again was previously precharged positively when $\phi_P$ was positive, remains more positive than the threshold of transistor 47. Therefore, line 51 remains coupled to ground potential through transistor 47. When $\phi_I$ becomes positive electrons are drawn from region 34 into channel 45 in the potential well defined beneath the two gates adjacent to region 34 since both $\phi_{4I}$ and $\phi_I$ are positive. Thus, a binary "0" read from region 30 on node 50 is returned to channel 39 in the form of a binary "1". It is apparent that with the timing signal shown in FIG. 4 that the outputs from channels 36 and 37 are multiplexed through the single amplifier 22, refreshed in the inverse sense, and returned alternately to channels 38 and 39.

In an identical manner charge sensed first from region 31 is refreshed in the inverse sense and transferred along channel 36 by amplifier 23. Likewise, charge sensed in region 33 is refreshed, again in the inverse sense, and transferred along channel 37.

In the presently preferred embodiment the binary "0" state in the registers is represented by a charge which is approximately 1/10 the magnitude of the charge representative of the binary "1" state. The binary "0" state does include some charge and is referred to as a "fat 0." As is known in the prior art, higher transfer efficiencies are obtained where fat zeroes are utilized as opposed to representing the binary "0" state with substantially no charge.

As is apparent, data stored within the register may be sensed on line 53, and furthermore, information may be written into the register via lines 54 and 51. Note that if a binary "1" is written into the register on line 51, after the register has been sequenced so that this bit is read from the register on line 53, a binary "1" will be read from the register since two inversions have occurred, one in amplifier 23 and the other in amplifier 22.

By using the presently disclosed register in an array of registers a high density memory is achieved. Specifically referring to FIG. 2, the use of a single amplifier at each end of the two pairs of channels, made possible by the multiplexing, provides a topographically efficient system. Also the use of the crossovers illustrated in FIG. 3 along with the gate arrangement discussed in conjunction with FIGS. 2 and 3 adds to the layout efficiency.

Thus, a high density charge-coupled memory has been disclosed which may be fabricated with MOS technology.

I claim:

1. A charge-coupled memory comprising:
 a plurality of charge-coupled shift registers, each of said shift registers including a first pair of channels and a second pair of channels, each of said channels being defined by a first region and a second region;
 a plurality of refresh means each for receiving an output charge from said second regions of said first pair of channels and for providing a refreshed charge to said second regions of said second pair of channels, and for receiving an output charge from said first regions of said second pair of channels and for providing a refreshed charge to said first regions of said first pair of channels;
 multiplexing means for multiplexing charge between said refresh means and said second regions of said first pair of channels and said second pair of channels, and for multiplexing charge between said refresh means and said first regions of said second pair of channels and said first pair of channels; and
 phased signal means for shifting charge in said shift registers coupled to said shift registers;
 whereby information may be stored and refreshed in said shift registers.

2. The memory defined in claim 1 wherein said phased signal means provides phased signals for shifting charge in each of said registers from said first regions of said first pair of channels, to said second regions of said first pair of channels, and from said second regions of said second pair of channels to said first regions of said second pair of channels.

3. The memory defined in claim 2 wherein said channels are in juxtaposition.

4. The memory defined by claim 3 wherein each of said registers include a plurality of gates for receiving said phased signals from said phased signal means, certain ones of said gates being operable both for shifting said charge and for multiplexing said charge.

5. The memory defined in claim 4 wherein said gates of each of said registers are disposed either on a first level above said channels, or on a second level above said channels.

6. The memory defined in claim 5 wherein said channels are n-channels.

7. In a charge-coupled memory, the combination of:
 a charge-coupled shift register having a first, second, third and fourth parallel channel, each channel having a first and a second end;
 a first and a second refresh amplifier, said first refresh amplifier being disposed adjacent to said first end of said parallel channels, and said second refresh amplifier being disposed adjacent to said second end of said parallel channels;
 multiplexing means for multiplexing charge between said first refresh amplifier and said first end of said first, second, third and fourth parallel channels, and for multiplexing charge between said second refresh amplifier and said second end of said first, second, third and fourth parallel channels;
 phased signal means for shifting charge in said first and second channels in one direction, and for shifting charge in said third and fourth channels in an opposite direction;
 whereby said parallel channels operate as a recirculating shift register in a memory.

8. The memory defined by claim 7 wherein said second refresh amplifier receives charge from said second end of said first and second channels and provides a refreshed charge to said second ends of said third and fourth channels, and wherein said first refresh amplifier receives charge from said first end of said third and fourth channels and provides a refreshed charge to said first ends of said first and second channels.

9. The memory defined by claim 8 wherein said refreshed charge provided by said first and said second amplifier represents the opposite binary state from the charge received by said first and said second amplifier.

10. A recirculating charge-coupled shift register comprising:
- a first and a second adjacent regions;
- a third and a fourth adjacent regions, said first and third regions defining a first channel and said second and fourth regions defining a second channel parallel to said first channel;
- a fifth and a sixth adjacent region;
- a seventh and an eighth adjacent region, said fifth and seventh regions defining a third channel and said sixth and eighth regions defining a fourth channel parallel to said first, second, third and fourth channels;
- a first refresh circuit for refreshing charge having an input coupled to said first and second regions and an output coupled to said seventh and eighth regions;
- a second refresh circuit for refreshing charge having an input coupled to said fifth and sixth regions and an output coupled to said third and fourth regions;
- multiplexing means for multiplexing charge between said first refresh circuit and the output of said first and second region and the input of said seventh and eighth regions and for multiplexing charge between said second refresh circuit and the output of said fifth and sixth regions and the input of said third and fourth regions;
- phased signal means for shifting charge in said first and second channels in one direction, and for shifting charge in said third and fourth channels in an opposite direction;

whereby charge may be circulated in said first, second, third and fourth regions.

11. The recirculating charge-coupled shift register defined in claim 10 wherein said first, second, third, fourth, fifth, sixth, seventh and eighth regions and said first and second refresh circuits are disposed on a common silicon substrate.

12. The recirculating shift register defined in claim 11 including a plurality of first level gates disposed at a first level above said first, second, third and fourth channels and a plurality of second level gates disposed at a second level above said first, second, third and fourth channels.

13. The recirculating shift register defined by claim 12 wherein said first level gates and said second level gates are defined by generally parallel lines disposed transversely to said parallel channels.

14. The recirculating shift register defined in claim 13 wherein said first, second, third, fourth, fifth, sixth, seventh and eighth regions are n-type regions.

15. The recirculating shift register defined in claim 14 wherein said first and third regions are larger than said second and fourth regions.

16. The recirculating shift register defined in claim 15 including signal means for shifting charge along said first and second channels in one direction and along said third and fourth channels in the opposite direction.

17. The recirculating shift register defined in claim 16 wherein said generally parallel lines defining gates at one of said first or second levels crossover said generally parallel lines defining gates at the other of said first or second levels between said second and third channels.

* * * * *